United States Patent

Yoshinaga

[11] Patent Number: 5,184,043
[45] Date of Patent: Feb. 2, 1993

[54] PIEZOELECTRIC RESONATOR

[75] Inventor: Takashi Yoshinaga, Kyoto, Japan

[73] Assignee: Murata Manufacturing Co., Ltd., Kyoto, Japan

[21] Appl. No.: 808,983

[22] Filed: Dec. 17, 1991

Related U.S. Application Data

[63] Continuation of Ser. No. 622,745, Dec. 5, 1990, abandoned.

Foreign Application Priority Data

Dec. 5, 1989 [JP] Japan ............... 1-140820[U]

[51] Int. Cl.$^5$ ............................................. H01L 41/08
[52] U.S. Cl. ........................... 310/320; 29/25.35; 310/326; 310/340
[58] Field of Search ............. 310/312, 320, 326, 340, 310/344, 348, 366; 29/25.35

[56] References Cited

U.S. PATENT DOCUMENTS

| | | | |
|---|---|---|---|
| 3,676,724 | 7/1972 | Berlincourt et al. | 310/320 |
| 3,747,176 | 7/1973 | Toyoshima | 310/340 X |
| 4,103,264 | 7/1978 | Howatt et al. | 310/340 X |
| 4,149,102 | 4/1979 | Kellen | 310/320 |
| 4,365,181 | 12/1982 | Yamamoto | 310/320 |

Primary Examiner—Mark O. Budd
Attorney, Agent, or Firm—Heller, Ehrman, White & McAuliffe

[57] ABSTRACT

In a method of applying a cavity forming material onto vibrating electrode parts provided on front and back surfaces by supplying the cavity forming material from above an uprightly arranged piezoelectric substrate, a cavity is defined not only around the vibrating electrode parts but also along the upper edge portion of the piezoelectric substrate upon sealing with armoring resin, since the cavity forming material partially remains on the upper edge portion of the piezoelectric substrate. Thus, necessary damping is not performed and spurious vibration is increased. According to the present invention, a solder damping electrode is provided at least on one of front and back surface portions of the piezoelectric substrate close to the upper edge portion supplied with the cavity forming member and solder is provided on this electrode, whereby spurious vibration of the upper edge portion of the piezoelectric substrate is damped by additional mass of the solder.

20 Claims, 3 Drawing Sheets

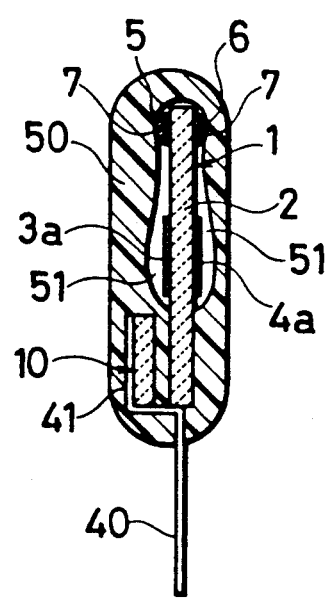
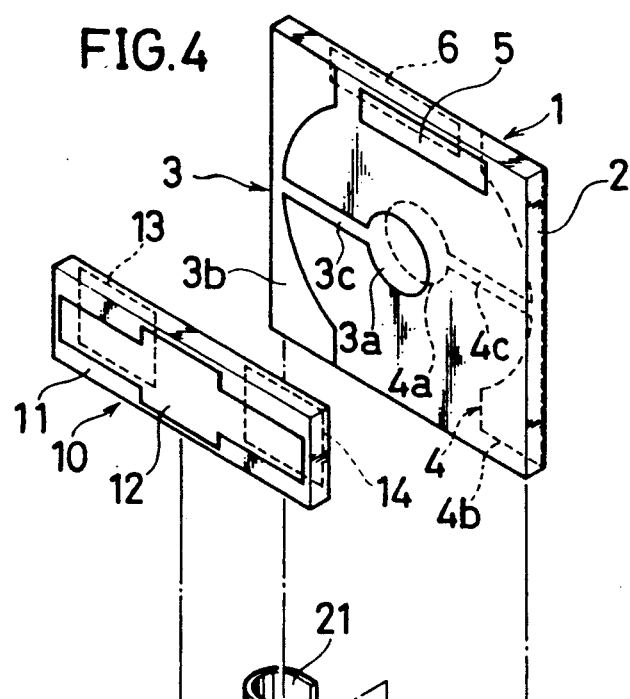
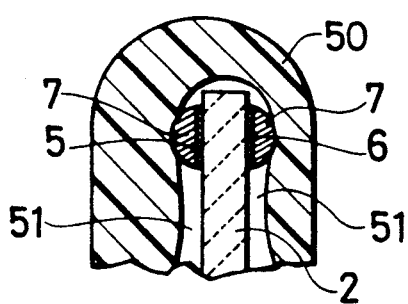
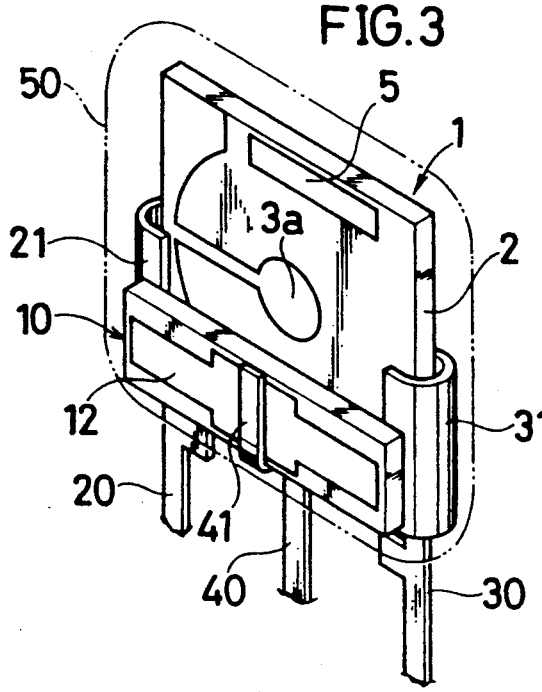
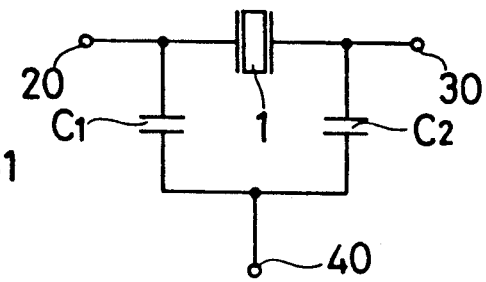

PIEZOELECTRIC RESONATOR

This is a continuation of application Ser. No. 07/622,745 filed Dec. 5, 1990, now abandoned.

BACKGROUND OF THE INVENTION

1. Field of the Invention

The present invention relates to a method of producing an energy trapped type piezoelectric resonator vibrating in the thickness expansion mode, and more particularly, it relates to a method of producing a piezoelectric resonator which is provided with a cavity inside an armoring resin member containing vibrating electrode parts thereof.

2. Description of the Background Art

In an energy trapped type piezoelectric resonator vibrating in the thickness expansion mode, main vibration is inevitably damped if armoring resin adheres to its vibrating electrode parts. Therefore, it is necessary to define a cavity around the vibrating electrode parts. Japanese Patent Publication Gazette No. 45-22384 (1970) discloses a conventional method of preliminarily applying a cavity forming material such as wax or paraffin, which is solid or semi-solid at room temperatures, easily softened upon heating and melting at a relatively low temperature, onto vibration electrode parts and heating it in or after sealing with armoring resin, for melting the cavity forming material and causing it to be absorbed by the armoring resin.

In this method, however, the cavity forming material is applied first onto a vibrating electrode part which is provided on a front surface of a piezoelectric substrate and then the substrate is turned over so that to apply the cavity forming material may be applied onto another vibrating electrode part which is provided on its back surface. Since the cavity forming material is applied onto the vibrating electrode parts in two steps, workability is poor. In case of a composite part comprising a resonator and a different element, such as a capacitor, arranged in parallel relationship with each other and the direction of thickness as described in Japanese Utility Model Laying-Open Gazette No. 1-74626 (1989), for example, it is difficult by this method to apply the cavity forming material onto a vibrating electrode part of the resonator.

In order to solve the aforementioned problem, Japanese Patent Laying-Open Gazette No. 1-125011 (1989) proposes a method of applying a cavity forming material onto vibrating electrode parts provided on front and back surfaces of a piezoelectric substrate in a single step without turning over the substrate. According to this method, the piezoelectric substrate is vertically arranged and the cavity forming material is supplied from above its upper edge and is simultaneously applied onto vibrating electrode parts on front and back surfaces of the piezoelectric substrate.

This method would be workable if the cavity forming the material were to be applied only over the vibrating electrode parts. In practice, however, the cavity forming material remains on the upper edge of the piezoelectric substrate, thereby causing an unwanted cavity to be created therealong when the periphery of the piezoelectric substrate is sealed with armoring resin. Although a piezoelectric resonator generally develops a response in an odd higher mode, it is possible to effectively suppress higher mode spurious vibrations without disturbing main responses if the cavity is created only around the vibrating electrode parts and is tightly sealed the same with armoring resin. However, if an unwanted cavity is created along the upper edge of the piezoelectric substrate as described above, energy that can be trapped is not sufficient and this is likely to cause higher mode spurious vibrations.

SUMMARY OF THE INVENTION

A principal object of the present invention is to provide a method of producing a piezoelectric resonator capable of damping spurious vibrations generated along a side edge portion of a piezoelectric substrate, where an unwanted cavity may be inadvertently created.

Another object of the present invention is to provide a piezoelectric resonator which can easily damp spurious vibrations without employing any specific material.

Still another object of the present invention is to provide a method of producing a piezoelectric resonator which can easily bring armoring resin into close contact with a required range to attain an improved vibration damping effect.

According to the present invention with which the above and other objects may be attained, a solder damping electrode an electrode solely for providing solder is provided on at least one of front and back surface portions of a piezoelectric substrate close to its side edge portion which is supplied with a cavity forming material, and solder is provided on the solder damping electrode.

When the cavity forming material is supplied from above the piezoelectric substrate which is uprightly arranged, the cavity forming material downwardly flows over the solder the adhere onto vibrating electrode parts. Thereafter, the piezoelectric substrate is sealed with armoring resin by a dipping or molding method, and the cavity forming material is heated in or after such sealing with the armoring resin, this causing the cavity forming material to be melted and absorbed by the armoring resin. Although the cavity forming material partially remains on the upper edge portion of the piezoelectric substrate to create a cavity on the upper edge portion in addition to that formed over the vibrating electrode parts, spurious vibrations of the upper edge portion of the piezoelectric substrate is damped by additional mass of the solder. Since it is impossible to directly fix the solder to the piezoelectric substrate, the solder damping electrode, is preliminarily formed on the piezoelectric substrate. Such a solder damping electrode can be formed by a well-known method at the same time with other electrodes and the solder can be provided simultaneously with connection of terminals, whereby no additional manufacturing step is required. Although the solder may be provided only on one surface of the piezoelectric substrate, it is preferable to supply it on both surfaces in order to improve the damping effect. In a situation where solder damping electrodes are provided on both surfaces of the piezoelectric substrate, it is preferable that they be kept in non-conductive relationship with the vibration electrode parts, terminal electrode parts and the like, in order to prevent generation of unwanted capacitance.

In place of the solder damping electrode(s) and the solder provided thereon, a material which tends to repel the cavity forming material may be applied onto at least one of front and back surface portions of the piezoelectric substrate close to its side edge portion which is supplied with the cavity forming material. In the case, the cavity forming material supplied from above the piezoelectric substrate is repelled by the previously applied repellent material and hardly adheres to the upper edge portion of the piezoelectric substrate. When the outer periphery of the piezoelectric substrate is sealed with armoring resin, therefore, the armoring resin adheres to the repellent material. In other words, the upper edge portion of the piezoelectric substrate is tightly sealed with the armoring resin through the repellent material, whereby spurious vibrations can be suppressed. Such a repellent material is generally prepared from an insulating material, unlike the solder damping electrode. Therefore, the repellent material can be overlappingly applied onto terminal electrode parts with no problem, so that the armoring resin can adhere over a wide range area. This contributes to further improvement of the vibration damping effect Since the cavity forming material is prepared from wax, paraffin or the like, a material having a mold releasing effect such as silicon resin or fluororesin is preferable since it is not separated from the piezoelectric substrate during working because it has to appropriate adhesive strength.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a sectional view showing resonator integrated with a capacitor, produced by a method of the present invention;

FIG. 2 is a partially enlarged view of the resonator of FIG. 1;

FIG. 3 is a perspective view showing the assembled resonator of FIG. 1;

FIG. 4 is an exploded perspective view showing the resonator of FIG. 3 before it is assembled;

FIG. 5 is an equivalent circuit diagram of the resonator of FIG. 1;

DESCRIPTION OF THE PREFERRED EMBODIMENTS

Figure 6:
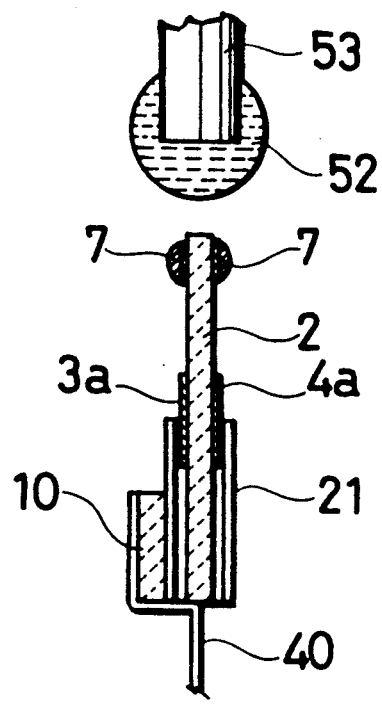
FIGS. 6 to 8 are sectional views showing steps of supplying a cavity forming material.

FIGS. 1 to 5 illustrate a resonator integrated with capacitor means produced by a method of the present invention.

Referring to these figures, a piezoelectric resonator 1 and a capacitor unit 10 are arranged in parallel relationship with each other, separated horizontally apart in the direction of their thickness, and connected with three terminals 20, 30 and 40, the peripheries of these elements being integrally sealed with an armoring resin member 50.

The piezoelectric resonator 1 is adapted to vibrate in the thickness expansion mode, and comprises a piezoelectric substrate 2 which is formed of a perpendicularly polarized square ceramic thin plate, an electrode 3 which is on the front surface of the substrate 2, and another electrode 4 of the same configuration which is on the back surface in 180° symmetry with respect to the first electrode 3. The electrode 3 on the front surface has a circular vibrating electrode part 3a which is located at the center of the substrate 2, a terminal electrode part 3b which is on a side edge portion of the substrate 2, and a thin extracting electrode part 3c which connects the electrode parts 3a and 3b with each other. The electrode 4 on the back surface is also has a vibrating electrode part 4a, a terminal electrode part 4b and an extracting electrode part 4c. Strip-shaped solder damping electrodes 5 and 6 are formed on front and back surface portions of the piezoelectric substrate 2 close to its upper edge portion in non-conductive relationship with respect to the electrodes 3 and 4. Solder members 7 are provided on these electrodes 5 and 6.

The capacitor unit 10 includes a dielectric substrate 11 made of a rectangular ceramic thin plate, a common electrode 12 which substantially entirely covers a surface of the substrate 11, and individual electrodes 13 and 14 which are provided on the back surface of the ceramic thin plate opposite from the common electrode 12 and each covering an area on the back surface adjacent to one of the side edges and about one-third of its width. Two capacitors $C_1$ and $C_2$ thereby formed between the end portions of the common electrode 12 and these individual electrodes 13 and 14 on the back surface.

The three terminals 20, 30 and 40 are formed by punching a hoop with a press and bending the punched members into configurations as shown. The outer input and output terminals 20 and 30 are symmetrical with each other. Upwardly extending holding parts 21 and 31 having U-shaped cross sections are provided on upper end portions of the input and output terminals 20 and 30 so as to be opposite to each other. Horizontally bent stopper parts 22 and 32 are provided on lower ends of the holding parts 21 and 31. The stopper parts 22 and 32 are adapted to prevent the resonator 1 from becoming displaced downward when it is inserted into the holding parts 21 and 31 from above. The stopper parts 22 and 32 have downwardly extending lower end portions, whose serving as unistructurally formed lead parts 23 and 33. A stepwisely bent holder member 41 is integrally provided on the upper end portion of the central grounding terminal 40. A horizontal step portion 42 is formed on the lower surface of this holder member 41 in order to the control the positions of lower surfaces of the resonator 1 and the capacitor unit 10. The step portion 42 is set at the same level with the stopper parts 22 and 32. A lead part 43 is unistructurally formed on the lower end portion of the grounding terminal 40.

FIG. 5 shows an equivalent circuit diagram of the resonator integrated with capacitor means, as described above and connected to a high frequency oscillator circuit such as a Colpitts oscillator circuit.

A method of manufacturing the resonator integrated with capacitor means as described above will be explained next with reference to FIG. 4 and FIGS. 6 to 8.

First, the electrodes 3 and 4 and the solder damping electrodes 5 and 6 are formed on the front and back surfaces of the piezoelectric substrate 2 as shown in FIG. 4, and the solder members 7 (not shown) are provided on the solder damping electrodes 5 and 6. Both end portions of the piezoelectric substrate 2 are inserted from above between the holding parts 21 and 31 of the input and output terminals 20 and 30, which are connected with each other by a strip member 29, so that the lower surfaces thereof are supported by the stopper parts 22 and 32 of the terminals 20 and 30. The capacitor unit 10 is inserted so as to extend along front surfaces of the holding parts 21 and 31, and the lower surface thereof is supported by the step portion 42 of the grounding terminal 40. When the resonator 1 and the capacitor unit 10 are thus temporarily held by the terminals 20, 30 and 40, solder or conductor paste is introduced into the holding parts 21 and 31, thereby fixing the input and output terminals 20 and 30 and the resonator 1 with each other while electrically connecting the holding parts 21 and 31 and the terminal electrode parts 3b and 4b of the resonator 1 with each other. The electrodes 13 and 14 provided on the back surface of the capacitor unit 10 are respectively connected to the holding parts 21 and 31 by soldering or the like. The common electrode 12 is similarly connected to the holder member 41 of the grounding terminal 40 to complete the physical attachment fixing and electrical connection of the capacitor unit 10.

Figure 7:
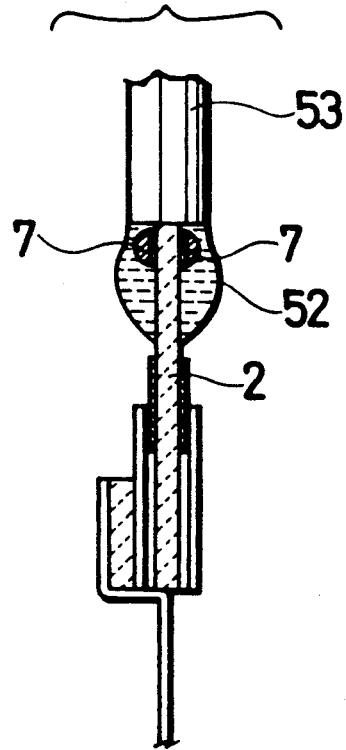

Thereafter the piezoelectric substrate 2 is vertically arranged as shown in FIG. 6, and a cavity forming material 52 such as wax or paraffin is supplied from above its upper edge by supplying means such as a trowel 53. The cavity forming material 52 is in a molten state since the trowel 53 is maintained at a high temperature. When the trowel 53 is brought into contact with or close to the upper edge of the piezoelectric substrate 2 as shown in FIG. 7, the cavity forming material 52 is transferred onto the piezoelectric substrate 2. In order to uniformly apply the cavity forming material 52 over the vibrating electrode parts 3a and 4a, it is important to locate the trowel 53 at the central portion of the piezoelectric substrate 2 along longitudinal and transverse directions.

Figure 8:
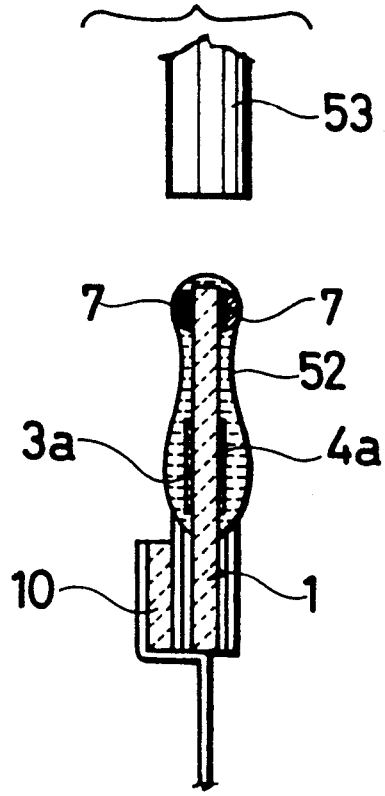

Next the trowel 53 is separated from the upper edge of the piezoelectric substrate 2 as shown in FIG. 8, so that the cavity forming material 52 transferred onto the piezoelectric substrate 2 is gravitated to cover the vibrating electrode parts 3a and 4a. The cavity forming material 52 separated from the trowel 53 is naturally cooled to be solidified or semi-solidified, and such solidification or semi-solidification of the cavity forming material 52 is substantially completed by the time it reaches the vibrating electrode parts 3a and 4a. Cold air may be introduced to prompt such solidification or semi-solidification of the cavity forming material 52 so that it can be correctly stopped at the vibrating electrode parts 3a and 4a.

After the cavity forming material 52 is thus applied to the vibrating electrode parts 3a and 4a, the peripheries of the resonator 1 and the capacitor unit 10 are sealed with an armoring resin member 50 of epoxy resin or the like by a dipping or molding method. Thereafter, the armoring resin member 50 is baked so that the cavity forming material 52 is melted and absorbed by the armoring resin member 50. Consequently, the surface portions of the substrate 2 covered with the cavity forming member 52 are transformed into a cavity 51, as shown in FIG. 1.

To the resonator 1 thus provided with the cavity 51, the solder members 7 are preliminarily provided on the upper end portions of the piezoelectric substrate 2. Therefore, even if the cavity 51 extends to cover the upper edge portion of the piezoelectric substrate 2, spurious vibrations of this portion are damped by the additional mass of the solder member. This has the favorable effect of improving the yield. Since the solder members 7 project from the piezoelectric substrate 2, the thickness of the cavity forming material 52 can be reduced on the solder members 7 so that the armoring resin member 50 can be brought into contact with the solder members 7 as shown in FIG. 2 due to shrinkage when hardened upon sealing. Thus, it is possible to further effectively suppress the spurious vibrations.

Figure 9:
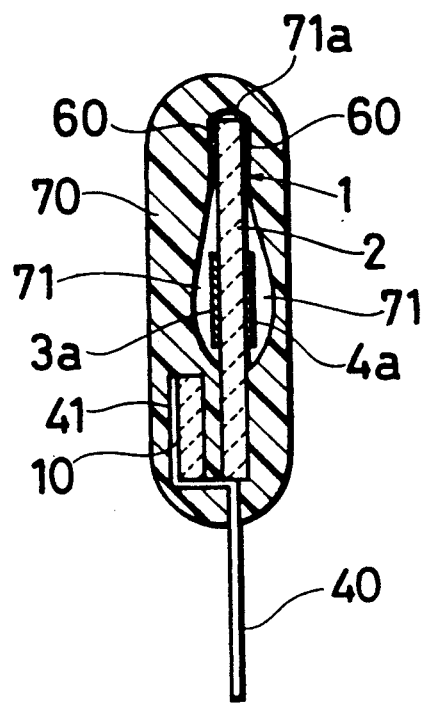
FIG. 9 is a sectional view showing another resonator produced by a method of the present invention.
Figure 10:
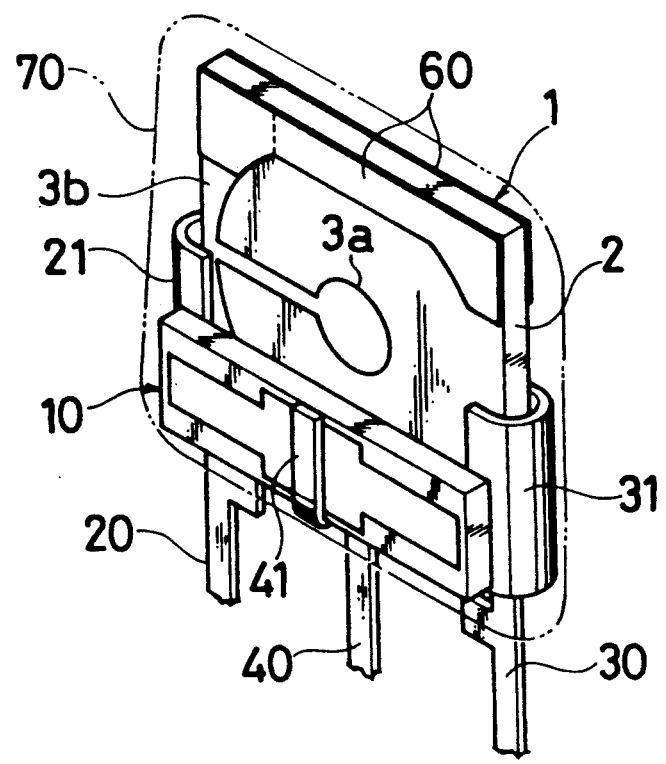
FIG. 10 is a perspective view showing the resonator of FIG. 9 when it is assembled.

FIGS. 9 and 10 illustrate another resonator produced by a method of the present invention. In FIGS. 9 and 10, parts which are identical to those already described above are denoted by the same reference numerals.

With reference to FIGS. 9 and 10, material 60 repelling a cavity forming material is preliminarily applied onto front and back surface portions of a piezoelectric substrate 2 close to its upper edge portion and along its entire length. An application technique such as printing may be used for this purpose. The material 60 can be prepared, for example, from silicon resin or fluororesin. If the material 60 is preliminarily applied onto the upper end portions of the piezoelectric substrate 2, most of the cavity forming material supplied from above the upper edge of the substrate 2 substantially over the material 60 and adheres to vibrating electrode parts 3a and 4a and portions close thereto. Therefore, both the front and back surfaces of the piezoelectric substrate 2 around its upper edge can be tightly sealed with an armoring resin member 70 over the material 60 as shown in FIG. 9, whereby it is possible to effectively suppress spurious vibrations.

The feature of this embodiment resides in that the repellent material 60 is made of an insulating material. Therefore, even if the repellent material 60 is applied over a wide area to partially overlap with terminal electrode parts 3b and 4b as shown in FIG. 10, it is possible to suppress or prevent adhesion of the cavity forming material without any adverse effects, say, on the capacitance. Thus, the armoring resin member 70 can be brought into close contact over a wide area, thereby improving the vibration damping effect. The repellent material 60 can be applied not only onto the front and back surfaces of the piezoelectric substrate 2, but also to its end surface. If this is done, it is possible to eliminate or reduce the portion 71a of a cavity 71 created on the end surface side of the piezoelectric substrate 2.

The present invention is not restricted to the above embodiments. Various modifications are available within the scope of the present invention. For example, the present invention may be applied to a simple piezoelectric resonator including no other element such as capacitor means, or a composite part formed by combination of a plurality of piezoelectric resonators.

According to the present invention, the lead parts of the terminals are not restricted to be substantially parallel to the piezoelectric substrate, but may be substantially perpendicularly arranged with respect to the piezoelectric substrate. Also in this case, the solder damping electrodes or the material repelling the cavity forming material may be formed on the upper end portions of the piezoelectric substrate, which is uprightly supported when the cavity forming material is applied from above.

Further, the solder damping electrodes the material repelling the cavity forming material need not be provided on both front and back surfaces of the piezoelectric substrate but may be provided only on one side although the vibration damping effect is improved if they are provided on both surfaces.

The above description of the invention is to be understood as illustrative and not limitative. Any variations and modifications that would be apparent to a person skilled in the art are intended to be included within the scope of this invention.

What is claimed is:

1. A method of producing an energy trapped type piezoelectric resonator vibrating in thickness expansion mode, said method comprising the steps of:
   providing a substrate element having a front surface, a back surface and an upper edge, said front and back surfaces each having thereon a vibrating electrode part and a solder damping electrode which is between said upper edge and said vibrating electrode part and is in contact with no conductive part;
   supporting said substrate by a downwardly protruding grounding electrode such that said front and back surfaces are substantially vertical and said upper edge is above said solder damping electrodes and said vibrating electrode parts on said front and back surfaces;
   applying solder members on said solder damping electrodes on said front and back surfaces to thereby damp spurious vibrations of said substrate element;
   causing a cavity forming material to drip from said upper edge slidingly over said solder damping electrodes and to thereby cover said vibrating electrode parts;
   applying a sealing material over said front and back surfaces and over said cavity forming material covering said vibrating electrode parts; and
   heating said sealing material so as to cause said cavity forming material to be absorbed by said sealing material and to thereby create a cavity between said vibrating electrode parts and said sealing material.

2. The method of claim 1 wherein said cavity forming material is solid or semi-solid at room temperatures.

3. The method of claim 2 wherein said cavity forming material is selected form wax and paraffin.

4. The method of claim 1 wherein said cavity forming material becomes solid or semi-solid by the time it comes to cover said vibrating electrode parts.

5. The method of claim 1 wherein said substrate element has solder damping electrodes on both said front and back surfaces, said solder damping electrodes being in non-conductive relationship with each other and with said vibrating electrode parts.

6. The method of claim 1 wherein said sealing material is caused to contact said solder members.

7. The method of claim 1 wherein said piezoelectric resonator is integrated with a capacitor means, said capacitor means having a grounding electrode and opposing electrodes opposite said grounding electrodes, said positioning step including temporarily supporting said substrate element and said capacitor means together by a plurality of terminals including input, output and grounding terminals such that said input and output terminals are each in contact with one of said vibrating electrode elements on said front or back surface and with one of said opposing electrodes of said capacitor means and that said grounding terminal is in contact with said grounding electrode of said capacitor means.

8. The method of claim 7 further comprising the step of applying solder on said terminals to thereby fasten said terminals to said substrate element and said capacitor means and on said front and back surfaces of said substrate element to thereby provide solder elements thereon which are in non-conductive relationship with said vibrating electrode parts.

9. The method of claim 1 wherein said solder damping electrode is near said upper edge.

10. The method of claim 5 wherein said solder damping electrodes are both near said upper edge.

11. A method of producing an energy trapped type piezoelectric resonator vibrating in thickness expansion mode, said method comprising the steps of:
    providing a substrate element having a front surface, a back surface and an upper edge, said front and back surfaces each having thereon a vibrating electrode part;
    supporting said substrate by a downwardly protruding grounding electrode such that said front and back surfaces are substantially vertical and said upper edge is above said solder damping electrodes on said front and back surfaces;
    applying an electrically insulative repelling material on upper portions of said front and back surfaces near said upper edge and above said vibrating electrode parts;
    causing a cavity forming material to drip from said upper edge slidingly over said repelling material and to thereby cover said vibrating electrode parts, said repelling material having the property of repelling said cavity forming material;
    applying a sealing material over said front and back surfaces and over said cavity forming material covering said vibrating electrode parts; and
    heating said sealing material so as to cause said cavity forming material to be absorbed by said sealing material and to thereby create a cavity between said vibrating electrode parts and said sealing material.

12. The method of claim 11 wherein said repelling material is made from silicon resin or fluororesin.

13. The method of claim 11 wherein said piezoelectric resonator is integrated with a capacitor means, said capacitor means having a grounding electrode and opposing electrodes opposite said grounding electrodes, said positioning step including temporarily supporting said substrate element and said capacitor means together by a plurality of terminals including input, output and grounding terminals such that said input and output terminals are each in contact with one of said vibrating electrode elements on said front or back surface and with one of said opposing electrodes of said capacitor means and that said grounding terminal is in contact with said grounding electrode of said capacitor means.

14. The method of claim 13 further comprising the step of applying solder on said terminals to thereby fasten said terminals to said substrate element and said capacitor means.

15. The method of claim 11 wherein said cavity forming material is solid or semi-solid at room temperatures.

16. The method of claim 15 wherein said cavity forming material is selected from wax and paraffin.

17. The method of claim 11 wherein said cavity forming material becomes solid or semi-solid by the time it comes to cover said vibrating electrode parts.

18. The method of claim 11 wherein said substrate element has repelling material on both said front and back surfaces.

19. The method of claim 11 wherein said repelling material is near said upper edge.

20. The method of claim 18 wherein said repelling material is near said upper edge.

* * * * *